(12) United States Patent
Jun et al.

(10) Patent No.: US 11,532,719 B2
(45) Date of Patent: Dec. 20, 2022

(54) TRANSISTORS ON HETEROGENEOUS BONDING LAYERS

(71) Applicant: Intel Corporation, Santa Clara, CA (US)

(72) Inventors: Kimin Jun, Portland, OR (US); Jack T. Kavalieros, Portland, OR (US); Gilbert Dewey, Beaverton, OR (US); Willy Rachmady, Beaverton, OR (US); Aaron Lilak, Beaverton, OR (US); Brennen Mueller, Portland, OR (US); Hui Jae Yoo, Portland, OR (US); Patrick Morrow, Portland, OR (US); Anh Phan, Beaverton, OR (US); Cheng-Ying Huang, Hillsboro, OR (US); Ehren Mannebach, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 847 days.

(21) Appl. No.: 16/222,946

(22) Filed: Dec. 17, 2018

(65) Prior Publication Data

US 2020/0194570 A1    Jun. 18, 2020

(51) Int. Cl.
| | |
|---|---|
| *H01L 29/423* | (2006.01) |
| *H01L 29/66* | (2006.01) |
| *H01L 29/49* | (2006.01) |
| *H01L 29/45* | (2006.01) |
| *H01L 29/786* | (2006.01) |

(Continued)

(52) U.S. Cl.
CPC .... *H01L 29/42392* (2013.01); *H01L 21/0254* (2013.01); *H01L 21/02532* (2013.01); *H01L 21/02543* (2013.01); *H01L 21/02546* (2013.01); *H01L 21/02603* (2013.01); *H01L 21/76251* (2013.01); *H01L 29/0673* (2013.01); *H01L 29/45* (2013.01); *H01L 29/4908* (2013.01); *H01L 29/66522* (2013.01); *H01L 29/66742* (2013.01); *H01L 29/78651* (2013.01);

(Continued)

(58) Field of Classification Search
None
See application file for complete search history.

(56) References Cited

U.S. PATENT DOCUMENTS

| | | | |
|---|---|---|---|
| 9,287,360 B1 * | 3/2016 | Basu | H01L 29/0847 |
| 9,455,317 B1 * | 9/2016 | Basker | B82Y 10/00 |

(Continued)

FOREIGN PATENT DOCUMENTS

WO    WO-2016209219 A1 * 12/2016  ........... H01L 29/775

*Primary Examiner* — Scott B Geyer
(74) *Attorney, Agent, or Firm* — Schwabe, Williamson & Wyatt, P.C.

(57) ABSTRACT

Embodiments herein describe techniques for a semiconductor device over a semiconductor substrate. A first bonding layer is above the semiconductor substrate. One or more nanowires are formed above the first bonding layer to be a channel layer. A gate electrode is around a nanowire, where the gate electrode is in contact with the first bonding layer and separated from the nanowire by a gate dielectric layer. A source electrode or a drain electrode is in contact with the nanowire, above a bonding area of a second bonding layer, and separated from the gate electrode by a spacer, where the second bonding layer is above and in direct contact with the first bonding layer.

18 Claims, 6 Drawing Sheets

(51) Int. Cl.
  *H01L 21/762* (2006.01)
  *H01L 21/02* (2006.01)
  *H01L 29/06* (2006.01)

(52) U.S. Cl.
  CPC .. *H01L 29/78681* (2013.01); *H01L 29/78684* (2013.01); *H01L 29/78696* (2013.01)

(56) References Cited

U.S. PATENT DOCUMENTS

| | | | |
|---|---|---|---|
| 10,962,588 B1* | 3/2021 | Hart | G06F 30/30 |
| 2007/0176824 A1* | 8/2007 | Stumbo | H01Q 3/34 |
| | | | 342/372 |
| 2010/0193770 A1* | 8/2010 | Bangsaruntip | B82Y 10/00 |
| | | | 977/762 |
| 2013/0161756 A1* | 6/2013 | Glass | H01L 29/0676 |
| | | | 257/E21.632 |
| 2013/0178019 A1* | 7/2013 | Bangsaruntip | B82Y 10/00 |
| | | | 438/149 |
| 2014/0166982 A1* | 6/2014 | Cohen | H01L 29/775 |
| | | | 257/29 |
| 2014/0175515 A1* | 6/2014 | Then | H01L 21/0251 |
| | | | 438/168 |
| 2015/0129830 A1* | 5/2015 | Sung | B41F 17/08 |
| | | | 438/283 |
| 2016/0118482 A1* | 4/2016 | Hong | H01L 29/66545 |
| | | | 438/157 |
| 2016/0190247 A1* | 6/2016 | Frank | H01L 21/31105 |
| | | | 438/151 |
| 2017/0077232 A1* | 3/2017 | Balakrishnan | H01L 29/6653 |
| 2018/0090624 A1* | 3/2018 | Cheng | H01L 29/78687 |
| 2018/0108733 A1* | 4/2018 | Augendre | H01L 29/66545 |
| 2018/0175035 A1* | 6/2018 | Yang | H01L 29/0673 |
| 2018/0175194 A1* | 6/2018 | Reboh | H01L 29/7842 |
| 2018/0254341 A1* | 9/2018 | Suk | H01L 29/0673 |

* cited by examiner

TRANSISTORS ON HETEROGENEOUS BONDING LAYERS

FIELD

Embodiments of the present disclosure generally relate to the field of integrated circuits, and more particularly, to transistors.

BACKGROUND

The transistor is the fundamental building block of integrated circuits (IC) and modern electronic devices, and is ubiquitous in modern electronic systems. A major driving force for IC technology is the ever increasing levels of circuit integration of more transistors, with improved performance and functionality, and reduced costs. Many different technologies have been developed for higher level of circuit integration, e.g., wafer scale integration, system-on-a-chip (SOC), three-dimensional (3-D) integration, silicon-on-insulator (SOI), and more. Use of wafer bonding technology is a promising approach to 3-D integration. However, each technology has its own problems to be solved.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Silicon-on-insulator (SOI) and wafer bonding technology are promising approaches to fabricate transistors and integrated circuits (IC) with improved performance. Transistors may have many different configurations or structures. Traditionally, a transistor may be formed having a channel within a substrate. A thin-film-transistor may be formed at the back end of an IC, where a channel may be formed above a metal interconnect. Furthermore, a transistor may be formed on an insulator layer over a substrate by SOI technology. A gate-all-around (GAA) for a nanowire of a transistor has a gate electrode around all sides of a nanowire. The GAA structure of a transistor may improve transistor performance by providing increased gate control over the channel area, e.g., the nanowire. However, the GAA structure of a transistor may post challenges for the SOI or wafer bonding technology, where a channel layer of the transistor is above an insulator layer or a bonding layer. For example, in wafer bonding technology, one side of the channel may be in direct contact with a bonding dielectric layer, which makes it difficult to fabricate a GAA for a nanowire. Similar issues may exist for the traditional SOI substrate, where one side of the channel of the transistor may be in direct contact with an insulator layer. In some designs, an undercut may be made at the insulator layer using isotropic etch. However, etch may propagate in all directions, which may lead to potential problems such as shorting to substrate and/or adjacent rail, irregular gate shape affecting electrostatics, and gate stack filling issue.

Embodiments herein may present a transistor on heterogeneous bonding layers, which is an improvement over the SOI or wafer bonding technology. Different from a traditional wafer bonding, multiple bonding layers, e.g., a first bonding layer and a second bonding layer, may be formed on a donor wafer. Furthermore, the multiple bonding layers may be bonded to, e.g., in direct contact with, a semiconductor substrate of a device wafer. The first bonding layer and the second bonding layer have different etch selectivity. Based on an etch selectivity of the first bonding layer over the second bonding layer, a part of the second bonding layer below a nanowire may be removed, while keeping the first bonding layer intact. A gate electrode can be formed completely around the nanowire, at the space of the removed part of the second bonding layer, and in contact with the first bonding layer. Hence, a GAA structure for a nanowire may be formed above the first bonding layer to have improved control over the channel layer including the nanowire.

Embodiments herein may present a semiconductor device. The semiconductor device includes a semiconductor substrate. A first bonding layer is above the semiconductor substrate. One or more nanowires are formed above the first bonding layer to be a channel layer, where the one or more nanowires include a semiconductor material. A gate electrode is around a nanowire of the one or more nanowires, where the gate electrode is in contact with the first bonding layer and separated from the nanowire by a gate dielectric layer. A source electrode is in contact with the nanowire, above a first bonding area of a second bonding layer, and separated from the gate electrode by a spacer, where the second bonding layer is above and in direct contact with the first bonding layer. Similarly, a drain electrode is in contact with the nanowire, above a second bonding area of the second bonding layer, and separated from the gate electrode by a spacer.

Embodiments herein may present a method for forming a semiconductor device. The method may include bonding a donor wafer with a device wafer to have a first bonding layer of the donor wafer above and in direct contact with a semiconductor substrate of the device wafer. The donor wafer includes the first bonding layer, a second bonding layer, and a semiconductor layer. The first bonding layer is in direct contact with the second bonding layer, and the second bonding layer is in direct contact with the semiconductor layer. The semiconductor layer of the donor wafer includes a semiconductor material. Additionally, the method includes patterning the semiconductor layer of the donor wafer and the second bonding layer simultaneously to form one or more nanowires above one or more portions of the second bonding layer. The one or more nanowires includes the semiconductor material. The method further includes removing, based on an etch selectivity of the first bonding layer over the second bonding layer, the one or more portions of the second bonding layer below the one or more nanowires. Moreover, the method includes forming a gate electrode around a nanowire of the one or more nanowires, where the gate electrode is in contact with the first bonding layer and separated from the one or more nanowires by a gate dielectric layer.

Embodiments herein may present a computing device, which may include a circuit board, and a processor or a memory device coupled to the circuit board. In more detail, the processor or the memory device includes a transistor. The transistor includes a semiconductor substrate. A first bonding layer is above the semiconductor substrate. One or more nanowires are formed above the first bonding layer to be a channel layer, where the one or more nanowires include a semiconductor material. A gate electrode is around a nanowire of the one or more nanowires, where the gate electrode is in contact with the first bonding layer and separated from the nanowire by a gate dielectric layer. A source electrode is in contact with the nanowire, above a first bonding area of a second bonding layer, and separated from the gate electrode by a spacer, where the second bonding layer is above and in direct contact with the first bonding layer. Similarly, a drain electrode is in contact with the nanowire, above a second bonding area of the second bonding layer, and separated from the gate electrode by a spacer.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1A:
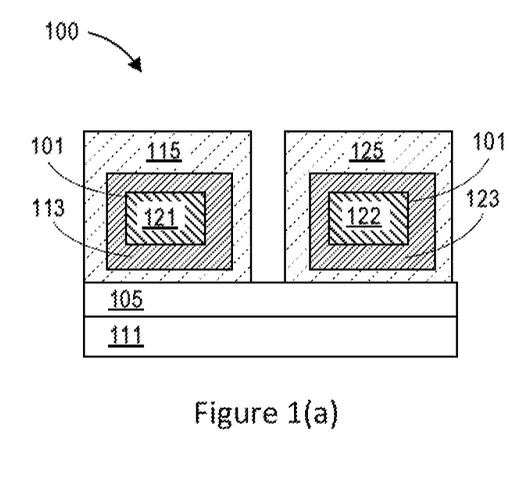
FIGS. 1(a)-1(b) schematically illustrate diagrams in cross-section views of a semiconductor device having a gate electrode around a nanowire and in contact with a bonding layer, in accordance with some embodiments.
Figure 1B:
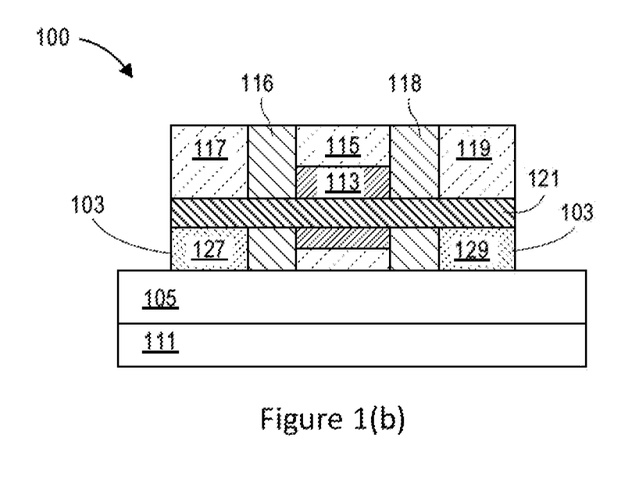

FIGS. 1(a)-1(b) schematically illustrate diagrams in cross-section views of a semiconductor device 100 having a gate electrode 115 around a nanowire 121 and in contact with a bonding layer 105, in accordance with some embodiments. For clarity, features of the semiconductor device 100, the gate electrode 115, the nanowire 121, and the bonding layer 105, may be described below as examples for understanding an example semiconductor device having a gate electrode around a nanowire and in contact with a bonding layer. It is to be understood that there may be more or fewer components within the semiconductor device 100, the gate electrode 115, the nanowire 121, and the bonding layer 105. Further, it is to be understood that one or more of the components within a semiconductor device having a gate electrode around a nanowire and in contact with a bonding layer, may include additional and/or varying features from the description below, and may include any device that one having ordinary skill in the art would consider and/or refer to as a semiconductor device having a gate electrode around a nanowire and in contact with a bonding layer.

In embodiments, as shown in FIG. 1(a), the semiconductor device 100 includes a semiconductor substrate 111, and the bonding layer 105, which is a first bonding layer, above the semiconductor substrate 111. A channel layer 101 above the bonding layer 105 includes one or more nanowires, e.g., a nanowire 121 and a nanowire 122, including a semiconductor material. A gate electrode is around a nanowire. For example, a gate electrode 115 is around the nanowire 121 and separated by a gate dielectric layer 113; while a gate electrode 125 is around the nanowire 122 and separated by a gate dielectric layer 123. The gate electrode 115 and the gate electrode 125 are in contact with the first bonding layer 105. In some embodiments, the gate electrode 115 is completely around the nanowire 121, and the gate electrode 125 is completely around the nanowire 122, so that the gate electrode may have better control over the nanowire. When a gate electrode is formed directly on an insulator layer as in SOI technology or on a wafer in the normal wafer bonding technology, one side of the nanowire or the channel layer may not be fully surrounded by the gate electrode. Therefore, the semiconductor device 100 may have improved performance since the gate electrode 115 may be completely around the nanowire 121, and the gate electrode 125 may be completely around the nanowire 122.

In embodiments, the nanowire 121 and the nanowire 122 in the channel layer 101 may be of various shapes or sizes. For example, the nanowire 121 or the nanowire 122 is of a rectangular prism shape. In some other embodiments, a cross-section of the nanowire 121 or the nanowire 122 may be of a rectangular shape, a circular shape, a triangular shape, a square shape, and a polygon shape. Furthermore, in some embodiments, the nanowire 121 and the nanowire 122 may be fins or nanoribbons.

In embodiments, as shown in FIG. 1(b), a second bonding layer 103 includes a first bonding area 127 and a second bonding area 129, above and in direct contact with the bonding layer 105. A source electrode 117 is in contact with the nanowire 121, above the first bonding area 127, and separated from the gate electrode 115 by a spacer 116. A drain electrode 119 is in contact with the nanowire 121, above the second bonding area 129, and separated from the gate electrode 115 by a spacer 118.

In some embodiments, the semiconductor substrate 111 may include an III-V substrate, a silicon substrate, a bulk substrate, or a glass substrate. The semiconductor material in the nanowire 121 and the nanowire 122 may include silicon (Si), germanium (Ge), silicon-germanium (SiGe), gallium arsenide (GaAs), indium gallium arsenide (InGaAs), indium phosphide (InP), or gallium nitride (GaN). The semiconductor material in the nanowire 121 and the nanowire 122 may be lattice mismatched with the material in the semiconductor substrate 111.

In embodiments, the bonding layer 105 and the second bonding layer 103 have different etch selectivity. Based on an etch selectivity of the bonding layer 105 over the second bonding layer 103, a part of the second bonding layer 103 below the nanowire 121 or the nanowire 122 may be removed, while keeping the bonding layer 105 intact. For example, the bonding layer 105 may have an etch selectivity over the second bonding layer 103 in a range of 10:1 to 80:1. In more details, the bonding layer 105 may include silicon dioxide, and the second bonding layer 103 may include silicon nitride; or the bonding layer 105 may include silicon oxide, and the second bonding layer 103 may include alumina. In some other embodiments, the bonding layer 105 may include a high-k dielectric material, and the second bonding layer 103 may include a low-k dielectric material.

In embodiments, the gate dielectric layer 113 between the gate electrode 115 and the nanowire 121, or the gate dielectric layer 123 between the gate electrode 125 and the nanowire 122 is to separate the gate electrode from the nanowire. The gate dielectric layer 113 or the gate dielectric layer 123 may include a high-k dielectric material selected from the group consisting of hafnium silicate, zirconium silicate, hafnium dioxide, zirconium dioxide, aluminum oxide, and nitride hafnium silicate.

In embodiments, the gate electrode 115, the gate electrode 125, the source electrode 117, or the drain electrode 119 may include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO. In some other embodiments, the gate electrode 115, the gate electrode 125, the source electrode 117, or the drain electrode 119 may be a stack including multiple layers, and may include a metal layer, and a metal sealant layer adjacent to the metal layer.

Figure 2:
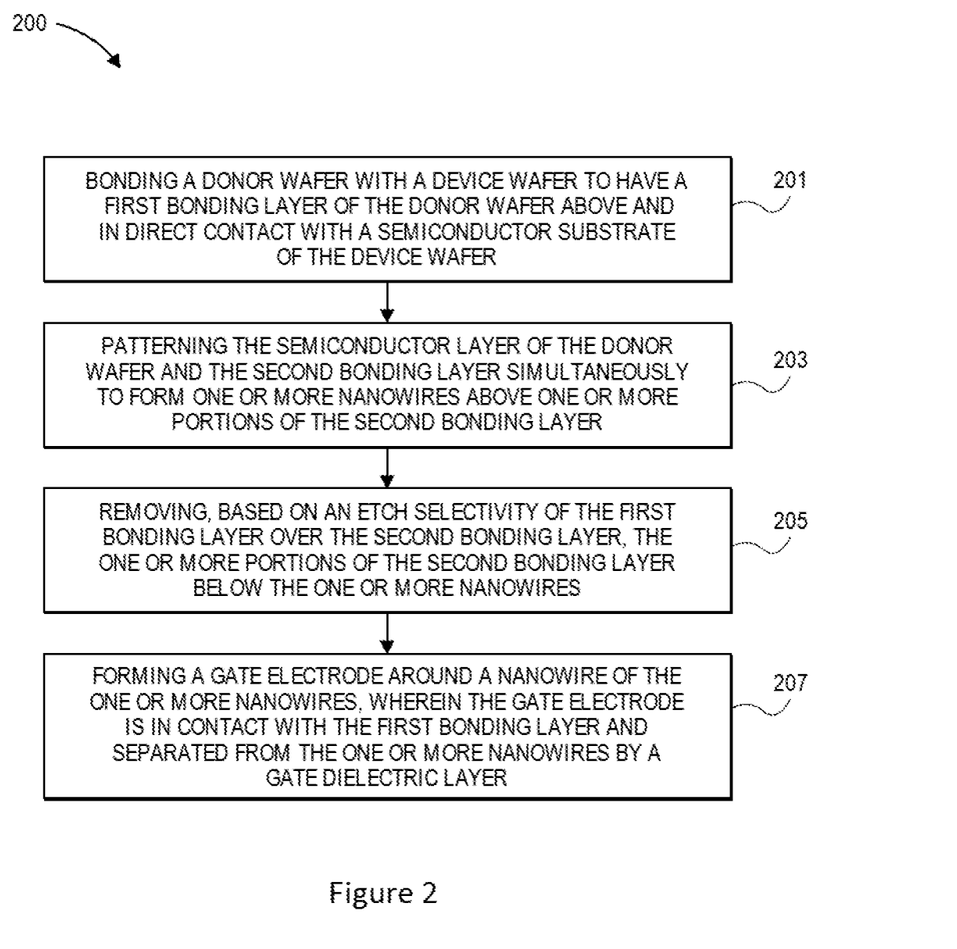
FIG. 2 schematically illustrates a process for forming a semiconductor device having a gate electrode around a nanowire and in contact with a bonding layer, in accordance with some embodiments.

FIG. 2 illustrates a process 200 for forming a semiconductor device having a gate electrode around a nanowire and in contact with a bonding layer, in accordance with some embodiments. More details of the process 200 are illustrated in FIGS. 3(a)-3(f). In embodiments, the process 200 may be applied to form the semiconductor device 100 having a gate electrode around a nanowire and in contact with a bonding layer, as shown in FIGS. 1(a)-1(b).

At block 201, the process 200 may include bonding a donor wafer with a device wafer to have a first bonding layer of the donor wafer above and in direct contact with a semiconductor substrate of the device wafer. For example, as shown in FIG. 3(b), the process 200 may include bonding a donor wafer 331 with a device wafer 341 to have a first bonding layer 305 of the donor wafer 331 above and in direct contact with a semiconductor substrate 311 of the device wafer 341. In embodiments, the donor wafer 331 includes the first bonding layer 305, a second bonding layer 303, and a semiconductor layer 301. The first bonding layer 305 is in direct contact with the second bonding layer 303, the second bonding layer 303 is in direct contact with the semiconductor layer 301. The semiconductor layer 301 of the donor wafer 331 includes a semiconductor material.

Figure 3A:
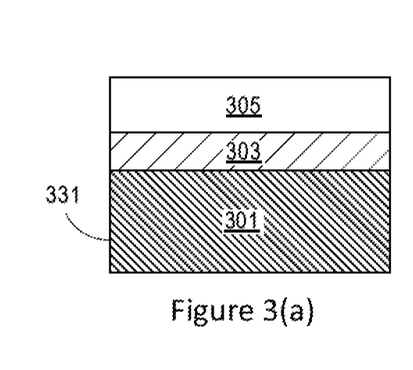
FIGS. 3(a)-3(f) schematically illustrate a process for forming a semiconductor device having a gate electrode around a nanowire and in contact with a bonding layer, in accordance with some embodiments.
Figure 3B:
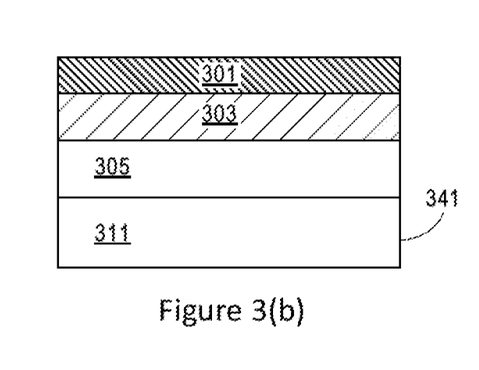

In embodiments, as shown in FIG. 3(a), additional actions may be performed to form the second bonding layer 303 in direct contact with the semiconductor layer 301 of the donor wafer 331, and to form the first bonding layer 305 in direct contact with the second bonding layer 303. Furthermore, actions may be performed to transfer the donor wafer 331 with the first bonding layer 305 and the second bonding layer 303 to have the first bonding layer 305 above and in direct contact with the semiconductor substrate 311 of the device wafer 341. As a result, the second bonding layer 303 is above the first bonding layer 305, and the semiconductor layer 301 of the donor wafer 331 is above the second bonding layer 303.

Figure 3C:
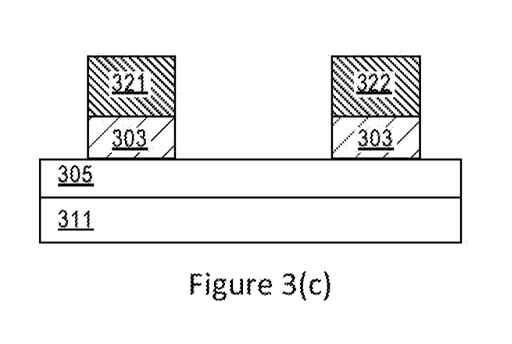

At block 203, the process 200 may include patterning the semiconductor layer of the donor wafer and the second bonding layer simultaneously to form one or more nanowires above one or more portions of the second bonding layer. For example, as shown in FIG. 3(c), the process 200 may include patterning the semiconductor layer 301 of the donor wafer 331 and the second bonding layer 303 simultaneously to form one or more nanowires, e.g., a nanowire 321, and a nanowire 322, above one or more portions of the second bonding layer 303. The nanowire 321 and the nanowire 322 include the semiconductor material of the semiconductor layer 301.

Figure 3D:
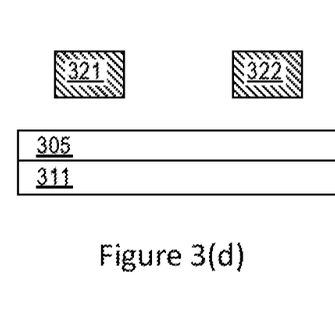

At block 205, the process 200 may include removing, based on an etch selectivity of the first bonding layer over the second bonding layer, the one or more portions of the second bonding layer below the one or more nanowires. For example, as shown in FIG. 3(d), the process 200 may include removing, based on an etch selectivity of the first bonding layer 305 over the second bonding layer 303, the one or more portions of the second bonding layer 303 below the nanowire 321 and the nanowire 322.

Figure 3E:
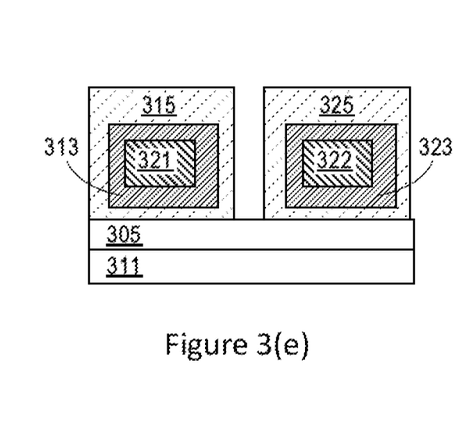

At block 207, the process 200 may include forming a gate electrode around a nanowire of the one or more nanowires, wherein the gate electrode is in contact with the first bonding layer and separated from the one or more nanowires by a gate dielectric layer. For example, as shown in FIG. 3(e), the process 200 may include forming a gate electrode 315 around the nanowire 321, where the gate electrode 315 is in contact with the first bonding layer 305 and separated from the nanowire 321 by a gate dielectric layer 313. Similarly, the process 200 may include forming a gate electrode 325 around the nanowire 322, where the gate electrode 325 is in contact with the first bonding layer 305 and separated from the nanowire 322 by a gate dielectric layer 323.

Figure 3F:
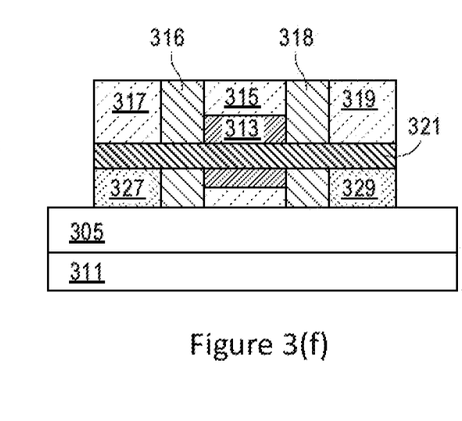

In addition, the process 200 may include additional operations to form other layers. For example, as shown in FIG. 3(f), the process 200 may include forming a source electrode 317 in contact with the nanowire 321, above a first bonding area 327 of the second bonding layer 303, and separated from the gate electrode 315 by a spacer 316. The process 200 may also include forming a drain electrode 319 in contact with the nanowire 321, above a second bonding area 329 of the second bonding layer 303, and separated from the gate electrode 315 by a spacer 318.

Figure 4:
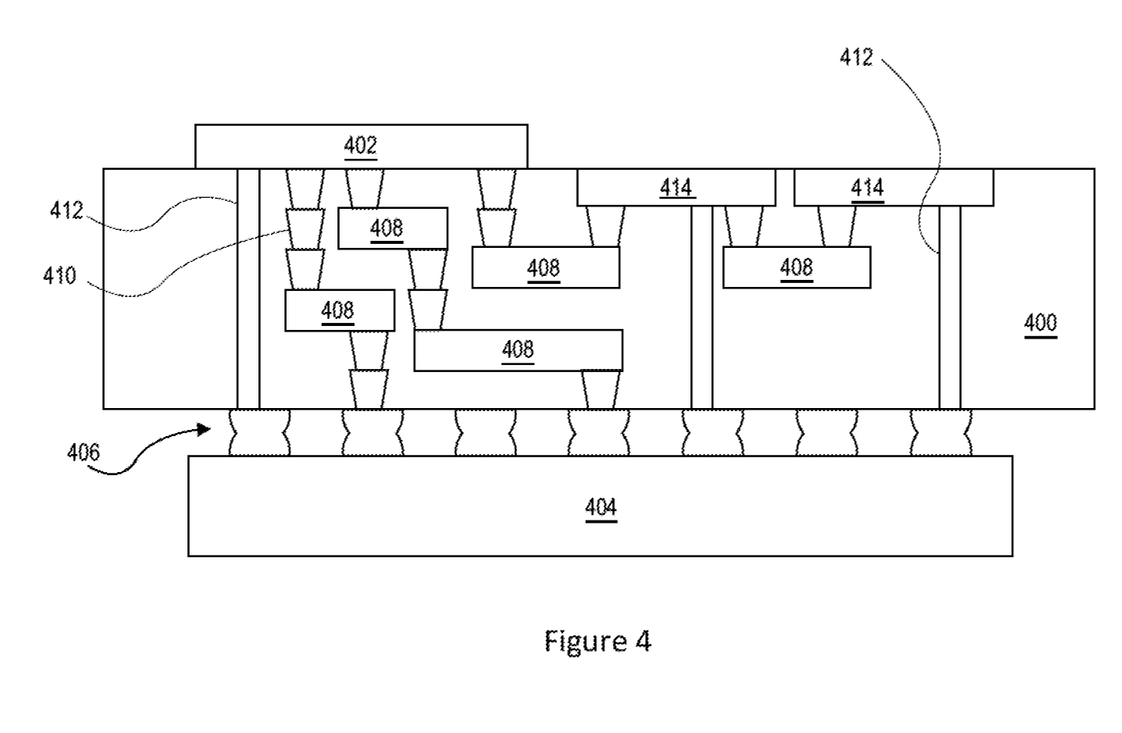
FIG. 4 schematically illustrates an interposer implementing one or more embodiments of the disclosure, in accordance with some embodiments.

FIG. 4 illustrates an interposer 400 that includes one or more embodiments of the disclosure. The interposer 400 is an intervening substrate used to bridge a first substrate 402 to a second substrate 404. The first substrate 402 may be, for instance, a substrate support for a semiconductor device, e.g., the semiconductor device 100 in FIGS. 1(a)-1(b), or a semiconductor device formed following the process 200 shown in FIG. 2. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the disclosure, apparatuses or processes disclosed herein may be used in the fabrication of interposer 400.

Figure 5:
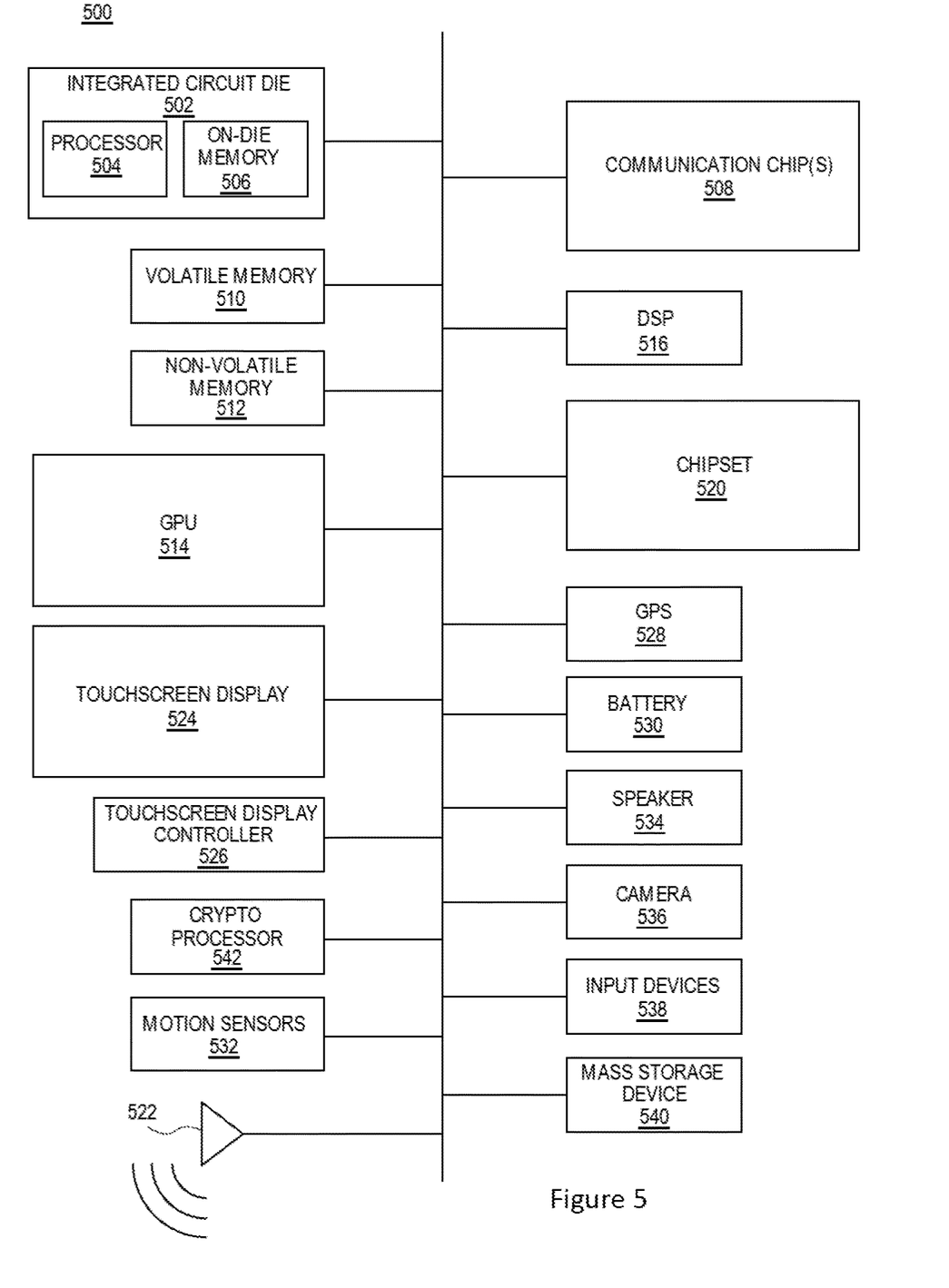
FIG. 5 schematically illustrates a computing device built in accordance with an embodiment of the disclosure, in accordance with some embodiments.

FIG. 5 illustrates a computing device 500 in accordance with one embodiment of the disclosure. The computing device 500 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 500 include, but are not limited to, an integrated circuit die 502 and at least one communications logic unit 508. In some implementations the communications logic unit 508 is fabricated within the integrated circuit die 502 while in other implementations the communications logic unit 508 is fabricated in a separate integrated circuit chip that may be bonded to a substrate or motherboard that is shared with or electronically coupled to the integrated circuit die 502. The integrated circuit die 502 may include a processor 504 as well as on-die memory 506, often used as cache memory, which can be provided by technologies such as embedded DRAM (eDRAM), or SRAM. For example, the processor 504 as well as the on-die memory 506 may include the semiconductor device 100 in FIGS. 1(a)-1(b), or a semiconductor device formed following the process 200 shown in FIG. 2.

In embodiments, the computing device 500 may include a display or a touchscreen display 524, and a touchscreen display controller 526. A display or the touchscreen display 524 may include a FPD, an AMOLED display, a TFT LCD, a micro light-emitting diode (LED) display, or others.

Computing device 500 may include other components that may or may not be physically and electrically coupled to the motherboard or fabricated within a SoC die. These other components include, but are not limited to, volatile memory 510 (e.g., dynamic random access memory (DRAM), non-volatile memory 512 (e.g., ROM or flash memory), a graphics processing unit 514 (GPU), a digital signal processor (DSP) 516, a crypto processor 542 (e.g., a specialized processor that executes cryptographic algorithms within hardware), a chipset 520, at least one antenna 522 (in some implementations two or more antenna may be used), a battery 530 or other power source, a power amplifier (not shown), a voltage regulator (not shown), a global positioning system (GPS) device 528, a compass, a motion coprocessor or sensors 532 (that may include an accelerometer, a gyroscope, and a compass), a microphone (not shown), a speaker 534, a camera 536, user input devices 538 (such as a keyboard, mouse, stylus, and touchpad), and a mass storage device 540 (such as hard disk drive, compact disk (CD), digital versatile disk (DVD), and so forth). The computing device 500 may incorporate further transmission, telecommunication, or radio functionality not already described herein. In some implementations, the computing device 500 includes a radio that is used to communicate over a distance by modulating and radiating electromagnetic waves in air or space. In further implementations, the computing device 500 includes a transmitter and a receiver (or a transceiver) that is used to communicate over a distance by modulating and radiating electromagnetic waves in air or space.

The communications logic unit 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 500 may include a plurality of communications logic units 508. For instance, a first communications logic unit 508 may be dedicated to shorter range wireless communications such as Wi-Fi, NFC, and Bluetooth and a second communications logic unit 508 may be dedicated to longer range wireless communications such as GPS, EDGE, GPRS, CDMA, WiMAX, LTE, Ev-DO, and others.

The processor 504 of the computing device 500 includes one or more devices, such as transistors. The term "processor" may refer to any device or portion of a device that processes electronic data from registers and/or memory to transform that electronic data into other electronic data that may be stored in registers and/or memory. The communications logic unit 508 may also include one or more devices, such as transistors.

In further embodiments, another component housed within the computing device 500 may contain one or more devices, such as DRAM, that are formed in accordance with implementations of the current disclosure, e.g., the semiconductor device 100 in FIGS. 1(*a*)-1(*b*), or a semiconductor device formed following the process 200 shown in FIG. 2.

In various embodiments, the computing device 500 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some non-limiting Examples are provided below.

Example 1 may include a semiconductor device, comprising: semiconductor substrate; a first bonding layer above the semiconductor substrate; one or more nanowires including a semiconductor material above the first bonding layer to form a channel layer; a gate electrode around a nanowire of the one or more nanowires, wherein the gate electrode is in contact with the first bonding layer and separated from the nanowire by a gate dielectric layer; a source electrode in contact with the nanowire, above a first bonding area of a second bonding layer, and separated from the gate electrode by a spacer, wherein the second bonding layer is above and in direct contact with the first bonding layer; and a drain electrode in contact with the nanowire, above a second bonding area of the second bonding layer, and separated from the gate electrode by a spacer.

Example 2 may include the semiconductor device of example 1 and/or some other examples herein, wherein the gate electrode is completely around the nanowire.

Example 3 may include the semiconductor device of example 1 and/or some other examples herein, wherein the semiconductor material in the one or more nanowires includes a material selected from the group consisting of silicon (Si), germanium (Ge), silicon-germanium (SiGe), gallium arsenide (GaAs), indium gallium arsenide (InGaAs), indium phosphide (InP), and gallium nitride (GaN).

Example 4 may include the semiconductor device of example 1 and/or some other examples herein, wherein the semiconductor material in the one or more nanowires is lattice mismatched with the semiconductor substrate.

Example 5 may include the semiconductor device of example 1 and/or some other examples herein, wherein the first bonding layer has an etch selectivity over the second bonding layer in a range of 10:1 to 80:1.

Example 6 may include the semiconductor device of example 1 and/or some other examples herein, wherein the first bonding layer includes silicon dioxide, and the second bonding layer includes silicon nitride.

Example 7 may include the semiconductor device of example 1 and/or some other examples herein, wherein the first bonding layer includes silicon oxide, and the second bonding layer includes alumina.

Example 8 may include the semiconductor device of example 1 and/or some other examples herein, wherein the first bonding layer includes a high-k dielectric material, and the second bonding layer includes a low-k dielectric material.

Example 9 may include the semiconductor device of example 1 and/or some other examples herein, further comprising: the gate dielectric layer between the gate electrode and the one or more nanowires to separate the gate electrode from the one or more nanowires.

Example 10 may include the semiconductor device of example 9 and/or some other examples herein, wherein gate dielectric layer includes a high-k dielectric material selected from the group consisting of hafnium silicate, zirconium silicate, hafnium dioxide, zirconium dioxide, aluminum oxide, and nitride hafnium silicate.

Example 11 may include the semiconductor device of example 1 and/or some other examples herein, wherein the semiconductor substrate includes a substrate selected from the group consisting of an III-V substrate, a silicon substrate, a bulk substrate, and a glass substrate.

Example 12 may include the semiconductor device of example 1 and/or some other examples herein, wherein the gate electrode, the source electrode, or the drain electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 13 may include a method for forming a semiconductor device, the method comprising: bonding a donor wafer with a device wafer to have a first bonding layer of the donor wafer above and in direct contact with a semiconductor substrate of the device wafer, wherein the donor wafer includes the first bonding layer, a second bonding layer, and a semiconductor layer, the first bonding layer is in direct contact with the second bonding layer, the second bonding layer is in direct contact with the semiconductor layer, and the semiconductor layer of the donor wafer includes a semiconductor material; patterning the semiconductor layer of the donor wafer and the second bonding layer simultaneously to form one or more nanowires above one or more portions of the second bonding layer, wherein the one or more nanowires includes the semiconductor material; removing, based on an etch selectivity of the first bonding layer over the second bonding layer, the one or more portions of the second bonding layer below the one or more nanowires; and forming a gate electrode around a nanowire of the one or more nanowires, wherein the gate electrode is in contact with the first bonding layer and separated from the one or more nanowires by a gate dielectric layer.

Example 14 may include the method of example 13 and/or some other examples herein, further comprising: forming a source electrode in contact with the nanowire, above a first bonding area of the second bonding layer, and separated from the gate electrode by a spacer; and forming a drain electrode in contact with the nanowire, above a second bonding area of the second bonding layer, and separated from the gate electrode by a spacer.

Example 15 may include the method of example 13 and/or some other examples herein, further comprising: forming the second bonding layer in direct contact with the semiconductor layer of the donor wafer; forming the first bonding layer in direct contact with the second bonding layer; and transferring the donor wafer with the first bonding layer and the second bonding layer to have the first bonding layer above and in direct contact with the semiconductor substrate of the device wafer, the second bonding layer above the first bonding layer, and the semiconductor layer of the donor wafer above the second bonding layer.

Example 16 may include the method of example 13 and/or some other examples herein, further comprising: forming the gate dielectric layer between the nanowire and the gate electrode.

Example 17 may include the method of example 13 and/or some other examples herein, wherein the gate electrode is completely around the nanowire.

Example 18 may include the method of example 13 and/or some other examples herein, wherein the semiconductor material in the one or more nanowires includes a material selected from the group consisting of silicon (Si), germanium (Ge), silicon-germanium (SiGe), gallium arsenide (GaAs), indium gallium arsenide (InGaAs), indium phosphide (InP), and gallium nitride (GaN).

Example 19 may include the method of example 13 and/or some other examples herein, wherein the first bonding layer has an etch selectivity over the second bonding layer in a range of 10:1 to 80:1.

Example 20 may include the method of example 13 and/or some other examples herein, wherein the semiconductor substrate includes a substrate selected from the group consisting of an III-V substrate, a silicon substrate, a bulk substrate, and a glass substrate.

Example 21 may include a computing device, comprising: a circuit board; and a processor or a memory device coupled to the circuit board, wherein the processor or the memory device includes a transistor comprising: a semiconductor substrate; a first bonding layer above the semiconductor substrate; one or more nanowires including a semiconductor material above the first bonding layer to form a channel layer; a gate electrode around a nanowire of the one or more nanowires, wherein the gate electrode is in contact with the first bonding layer and separated from the one or more nanowires by a gate dielectric layer; a source electrode in contact with the nanowire, above a first bonding area of the second bonding layer, and separated from the gate electrode by a spacer, wherein the second bonding layer is above and in direct contact with the first bonding layer; and a drain electrode in contact with the nanowire, above a second bonding area of the second bonding layer, and separated from the gate electrode by a spacer.

Example 22 may include computing device of example 21 and/or some other examples herein, wherein the semiconductor material in the one or more nanowires includes a material selected from the group consisting of silicon (Si), germanium (Ge), silicon-germanium (SiGe), gallium arsenide (GaAs), indium gallium arsenide (InGaAs), indium phosphide (InP), and gallium nitride (GaN).

Example 23 may include computing device of example 21 and/or some other examples herein, wherein the semiconductor material in the one or more nanowires is lattice mismatched with the semiconductor substrate.

Example 24 may include computing device of example 21 and/or some other examples herein, wherein the first bonding layer has an etch selectivity over the second bonding layer in a range of 10:1 to 80:1.

Example 25 may include computing device of example 21 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
a semiconductor substrate;
a first bonding layer above the semiconductor substrate;
one or more nanowires including a semiconductor material above the first bonding layer to form a channel layer;
a gate electrode around a nanowire of the one or more nanowires, wherein the gate electrode is in contact with the first bonding layer and separated from the nanowire by a gate dielectric layer;
a source electrode in contact with the nanowire, above a first bonding area of a second bonding layer, the source electrode and the second bonding layer separated from the gate electrode by a first spacer, wherein the second bonding layer is above and in direct contact with the first bonding layer; and a drain electrode in contact with the nanowire, above a second bonding area of the second bonding layer, the drain electrode and the second bonding layer separated from the gate electrode by a second spacer.

2. The semiconductor device of claim 1, wherein the gate electrode is completely around the nanowire.

3. The semiconductor device of claim 1, wherein the semiconductor material in the one or more nanowires includes a material selected from the group consisting of silicon (Si), germanium (Ge), silicon-germanium (SiGe), gallium arsenide (GaAs), indium gallium arsenide (InGaAs), indium phosphide (InP), and gallium nitride (GaN).

4. The semiconductor device of claim 1, wherein the semiconductor material in the one or more nanowires is lattice mismatched with the semiconductor substrate.

5. The semiconductor device of claim 1, wherein the first bonding layer has an etch selectivity over the second bonding layer in a range of 10:1 to 80:1.

6. The semiconductor device of claim 1, wherein the first bonding layer includes silicon dioxide, and the second bonding layer includes silicon nitride.

7. The semiconductor device of claim 1, wherein the first bonding layer includes silicon oxide, and the second bonding layer includes alumina.

8. The semiconductor device of claim 1, wherein the first bonding layer includes a high-k dielectric material, and the second bonding layer includes a low-k dielectric material.

9. The semiconductor device of claim 1, wherein gate dielectric layer includes a high-k dielectric material selected from the group consisting of hafnium silicate, zirconium silicate, hafnium dioxide, zirconium dioxide, aluminum oxide, and nitride hafnium silicate.

10. The semiconductor device of claim 1, wherein the semiconductor substrate includes a substrate selected from the group consisting of an III-V substrate, a silicon substrate, a bulk substrate, and a glass substrate.

11. The semiconductor device of claim 1, wherein the gate electrode, the source electrode, or the drain electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

12. A computing device, comprising:
a circuit board; and
a processor or a memory device coupled to the circuit board, wherein the processor or the memory device includes a transistor comprising:
a semiconductor substrate;
a first bonding layer above the semiconductor substrate;
one or more nanowires including a semiconductor material above the first bonding layer to form a channel layer;
a gate electrode around a nanowire of the one or more nanowires, wherein the gate electrode is in contact with the first bonding layer and separated from the one or more nanowires by a gate dielectric layer;
a source electrode in contact with the nanowire, above a first bonding area of the second bonding layer, the source electrode and the second bonding layer separated from the gate electrode by a first spacer, wherein the second bonding layer is above and in direct contact with the first bonding layer; and
a drain electrode in contact with the nanowire, above a second bonding area of the second bonding layer, the drain electrode and the second bonding layer separated from the gate electrode by a second spacer.

13. The computing device of claim 12, wherein the semiconductor material in the one or more nanowires includes a material selected from the group consisting of silicon (Si), germanium (Ge), silicon-germanium (SiGe), gallium arsenide (GaAs), indium gallium arsenide (InGaAs), indium phosphide (InP), and gallium nitride (GaN).

14. The computing device of claim 12, wherein the semiconductor material in the one or more nanowires is lattice mismatched with the semiconductor substrate.

15. The computing device of claim 12, wherein the first bonding layer has an etch selectivity over the second bonding layer in a range of 10:1 to 80:1.

16. The computing device of claim 12, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

17. A semiconductor device, comprising:
a semiconductor substrate;
a first bonding layer above the semiconductor substrate;
one or more nanowires including a semiconductor material above the first bonding layer to form a channel layer;
a gate electrode around a nanowire of the one or more nanowires, wherein the gate electrode is in contact with the first bonding layer and separated from the nanowire by a gate dielectric layer;
a source electrode in contact with the nanowire, above a first bonding area of a second bonding layer, and separated from the gate electrode by a spacer, wherein the second bonding layer is above and in direct contact with the first bonding layer; and
a drain electrode in contact with the nanowire, above a second bonding area of the second bonding layer, and separated from the gate electrode by a spacer, wherein the first bonding layer includes silicon oxide, and the second bonding layer includes alumina.

18. A semiconductor device, comprising:
a semiconductor substrate;
a first bonding layer above the semiconductor substrate;
one or more nanowires including a semiconductor material above the first bonding layer to form a channel layer;
a gate electrode around a nanowire of the one or more nanowires, wherein the gate electrode is in contact with the first bonding layer and separated from the nanowire by a gate dielectric layer;
a source electrode in contact with the nanowire, above a first bonding area of a second bonding layer, and separated from the gate electrode by a spacer, wherein the second bonding layer is above and in direct contact with the first bonding layer; and
a drain electrode in contact with the nanowire, above a second bonding area of the second bonding layer, and separated from the gate electrode by a spacer, wherein the first bonding layer includes a high-k dielectric material, and the second bonding layer includes a low-k dielectric material.

\* \* \* \* \*